US008347482B2

(12) United States Patent
Hasegawa

(10) Patent No.: US 8,347,482 B2
(45) Date of Patent: Jan. 8, 2013

(54) METHOD FOR MANUFACTURING FERRITE MAGNET DEVICE, METHOD FOR MANUFACTURING NON-RECIPROCAL CIRCUIT DEVICE, AND METHOD FOR MANUFACTURING COMPOSITE ELECTRONIC COMPONENT

(75) Inventor: Takashi Hasegawa, Oumihachiman (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 535 days.

(21) Appl. No.: 12/401,655

(22) Filed: Mar. 11, 2009

(65) Prior Publication Data

US 2009/0255103 A1 Oct. 15, 2009

(30) Foreign Application Priority Data

Apr. 9, 2008 (JP) ................................ 2008-101672

(51) Int. Cl.
*G01R 31/28* (2006.01)

(52) U.S. Cl. ............. 29/593; 29/25.42; 29/594; 29/595; 29/607; 335/302; 335/303; 335/305; 335/306; 367/166; 381/405; 381/423; 600/1; 600/407

(58) Field of Classification Search ................. 29/25.42, 29/592.1, 593, 602.1, 607; 335/302–306; 600/1, 407; 381/405, 423; 367/166
See application file for complete search history.

(56) References Cited

U.S. PATENT DOCUMENTS

| | | | | |
|---|---|---|---|---|
| 5,945,887 | A * | 8/1999 | Makino et al. | 333/1.1 |
| 7,532,084 | B2 * | 5/2009 | Wada et al. | 333/24.2 |
| 2002/0097104 | A1 | 7/2002 | Nakagawa et al. | |
| 2004/0263278 | A1 * | 12/2004 | Hino | 333/24.2 |

FOREIGN PATENT DOCUMENTS

| | | | |
|---|---|---|---|
| JP | 09045523 | A * | 2/1997 |
| JP | 2002-299914 | A | 10/2002 |
| JP | 2002-330004 | A | 11/2002 |
| JP | 2005-117500 | A | 4/2005 |

* cited by examiner

*Primary Examiner* — Paul D Kim

(74) *Attorney, Agent, or Firm* — Dickstein Shapiro LLP

(57) ABSTRACT

A method for manufacturing a ferrite magnet device including a ferrite body and first and second center electrodes arranged so as to intersect and be electrically insulated from each other and a permanent magnet arranged to apply a direct current magnetic field to the ferrite body and a method for manufacturing an isolator or a composite electronic component, which include the ferrite magnet device. A magnetic force of the permanent magnet is adjusted using a measurement jig and a magnetic force adjusting apparatus while the permanent magnet is fixed to a principal surface of the ferrite body.

11 Claims, 12 Drawing Sheets

METHOD FOR MANUFACTURING FERRITE MAGNET DEVICE, METHOD FOR MANUFACTURING NON-RECIPROCAL CIRCUIT DEVICE, AND METHOD FOR MANUFACTURING COMPOSITE ELECTRONIC COMPONENT

BACKGROUND OF THE INVENTION

1. Field of the Invention

The present invention relates to a method for manufacturing a ferrite magnet device, a method for manufacturing a non-reciprocal circuit device including the ferrite magnet device, and a method for manufacturing a composite electronic component including the non-reciprocal circuit device.

2. Description of the Related Art

Conventional non-reciprocal circuit devices, e.g., isolators and circulators, have a characteristic that signals are transmitted in a specific direction and are not transmitted in the reverse direction. For example, an isolator is used to transmit circuit portions of mobile communication equipment, e.g., automobile telephones and cellular phones, by utilizing this characteristic.

In general, this type of non-reciprocal circuit device includes a ferrite magnet device composed of a ferrite body provided with a center electrode and a permanent magnet arranged to apply a direct current magnetic field thereto and a predetermined matching circuit device including a resistance and a capacitor. Furthermore, a composite electronic component including a plurality of non-reciprocal circuit devices, or a composite electronic component including a non-reciprocal circuit device and a power amplifier device have been provided as modules.

In the above-described non-reciprocal circuit device and composite electronic component, electrical characteristics thereof must be measured and adjusted. Japanese Unexamined Patent Application Publication No. 2002-299914 discloses that the capacitance and the resistance are measured so as to have a predetermined capacitance value and resistance value or they are adjusted to predetermined values by trimming or other suitable methods before being connected to the center electrode, and the center electrode is subjected to a magnetic force adjustment after being assembled into a non-reciprocal circuit device. Japanese Unexamined Patent Application Publication No. 2005-117500 discloses that a non-reciprocal circuit device and a power amplifier are assembled into one unit and, thereafter, the magnetic flux density of a permanent magnet is adjusted.

However, in a non-reciprocal circuit device or the composite circuit device including the non-reciprocal circuit device, there are large fluctuations in characteristics due to variations in characteristics of the ferrite body provided with the center electrode or the permanent magnet, and in particular, variations in magnetic force of the permanent magnet. Consequently, the inductance of the center electrode deviates significantly from a predetermined value because of this factor, and non-adjustable devices may result. In the manufacturing method according to the related art, the magnetic force is adjusted at a stage in which the matching circuit device has been incorporated or the power amplifier has been combined. Therefore, if a non-adjustable device is found, the non-adjustable device has to be discarded, and there is a problem in that the matching circuit devices, power amplifiers, and other combined components are wasted.

SUMMARY OF THE INVENTION

To overcome the problems described above, preferred embodiments of the present invention provide a method for manufacturing a ferrite magnet device, a method for manufacturing a non-reciprocal circuit device, and a method for manufacturing a composite electronic component, which methods avoid wasting of mounted components, e.g., matching circuit devices and power amplifiers.

According to a preferred embodiment of the present invention, a method for manufacturing a ferrite magnet device including a ferrite body and a plurality of center electrodes arranged so as to intersect and be electrically insulated from each other and a permanent magnet arranged to apply a direct current magnetic field to the ferrite body includes the step of adjusting a magnetic force of the permanent magnet using a measurement jig and a magnetic force adjusting apparatus while the permanent magnet is fixed to a principal surface of the ferrite body.

According to a preferred embodiment of the present invention, a method for manufacturing a non-reciprocal circuit device including a ferrite magnet device including a ferrite body and a plurality of center electrodes arranged so as to intersect and be electrically insulated from each other and a permanent magnet arranged to apply a direct current magnetic field to the ferrite body includes the steps of adjusting a magnetic force of the permanent magnet using a measurement jig and a magnetic force adjusting apparatus while the permanent magnet is fixed to a principal surface of the ferrite body and assembling the ferrite magnet device and other devices after the adjustment.

According to a preferred embodiment of the present invention, a method for manufacturing a composite electronic component including a ferrite magnet device including a ferrite body and a plurality of center electrodes arranged so as to intersect and be electrically insulated from each other and a permanent magnet arranged to apply a direct current magnetic field to the ferrite body includes the steps of adjusting a magnetic force of the permanent magnet using a measurement jig and a magnetic force adjusting apparatus while the permanent magnet is fixed to a principal surface of the ferrite body and assembling the ferrite magnet device and other devices after the adjustment.

According to a preferred embodiment of the present invention, the magnetic force of the permanent magnet is adjusted at the stage of the ferrite magnet device which is a factor in the variations in electrical characteristics. Therefore, non-adjustable ferrite magnet devices can be excluded in advance, and wasting of mounted components, e.g., matching circuit devices and power amplifiers, which are incorporated thereafter, can be avoided.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

A method for manufacturing a ferrite magnet device, a method for manufacturing a non-reciprocal circuit device, and a method for manufacturing a composite electronic component according to preferred embodiments of the present invention will be described below with reference to attached drawings.

Ferrite Magnet Device and Isolator

Figure 1:
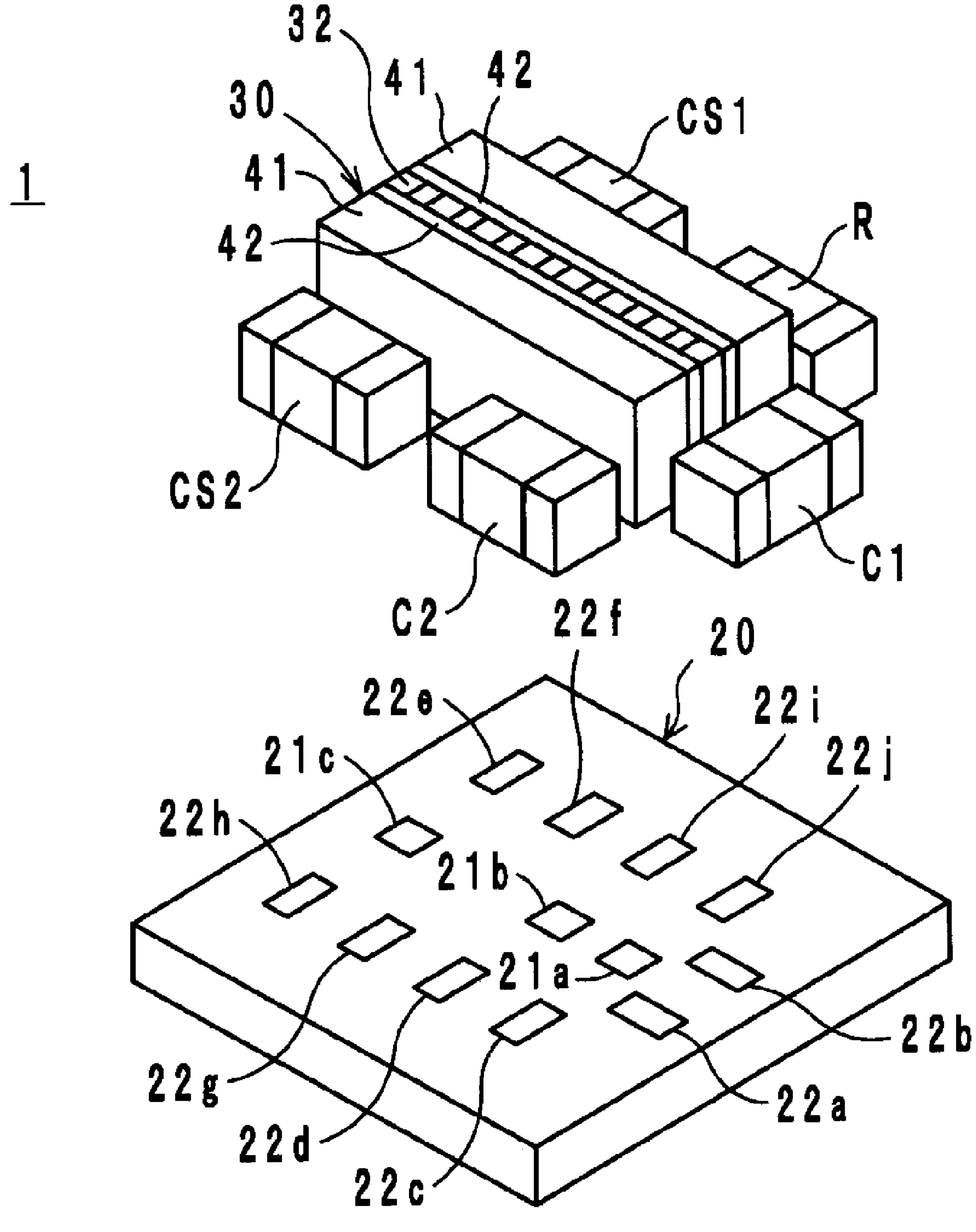
FIG. 1 is an exploded perspective view showing a non-reciprocal circuit device including a ferrite magnet device produced according to a preferred embodiment of the present invention.

FIG. 1 is an exploded perspective view showing a two-port type isolator 1, which is an example of a non-reciprocal circuit device according to a preferred embodiment of the present invention. This two-port type isolator 1 preferably is a lumped-constant isolator and includes a substrate 20 and a ferrite magnet device 30 including ferrite body 32 and a pair of permanent magnets 41.

Figure 2:
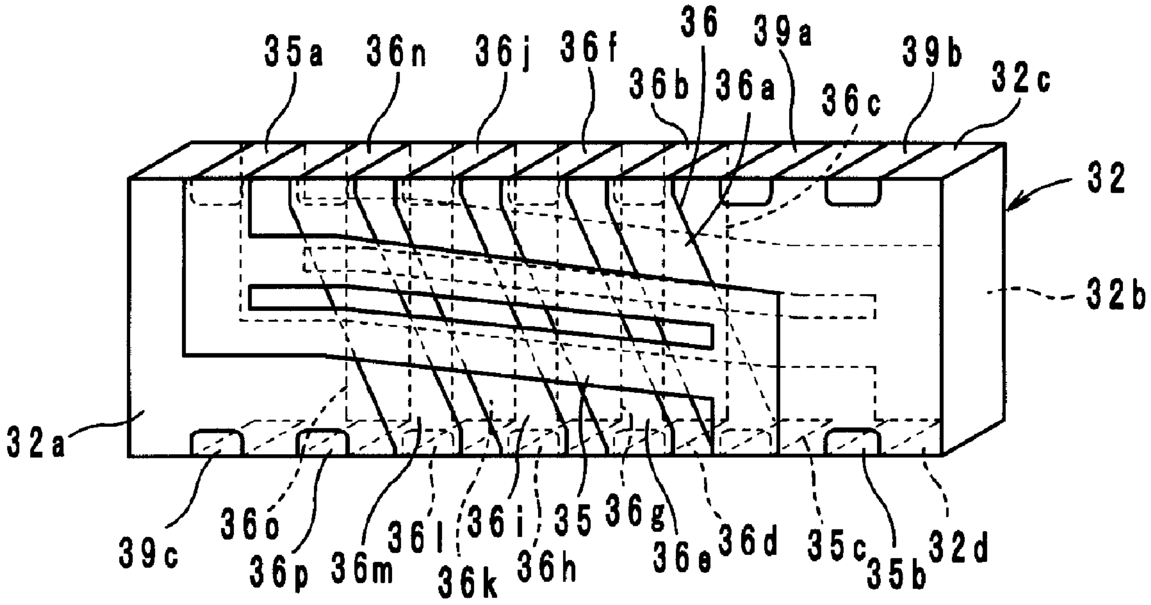
FIG. 2 is a perspective view showing a ferrite body with center electrodes.

As shown in FIG. 2, the ferrite body 32 is provided with a first center electrode 35 and a second center electrode 36 that are electrically insulated from each other on front and back-side principal surfaces 32*a* and 32*b*. Here, the ferrite body 32 preferably is substantially in the shape of a rectangle having a first principal surface 32*a* and a second principal surface 32*b* opposite and in parallel or substantially in parallel to each other.

Figure 4:
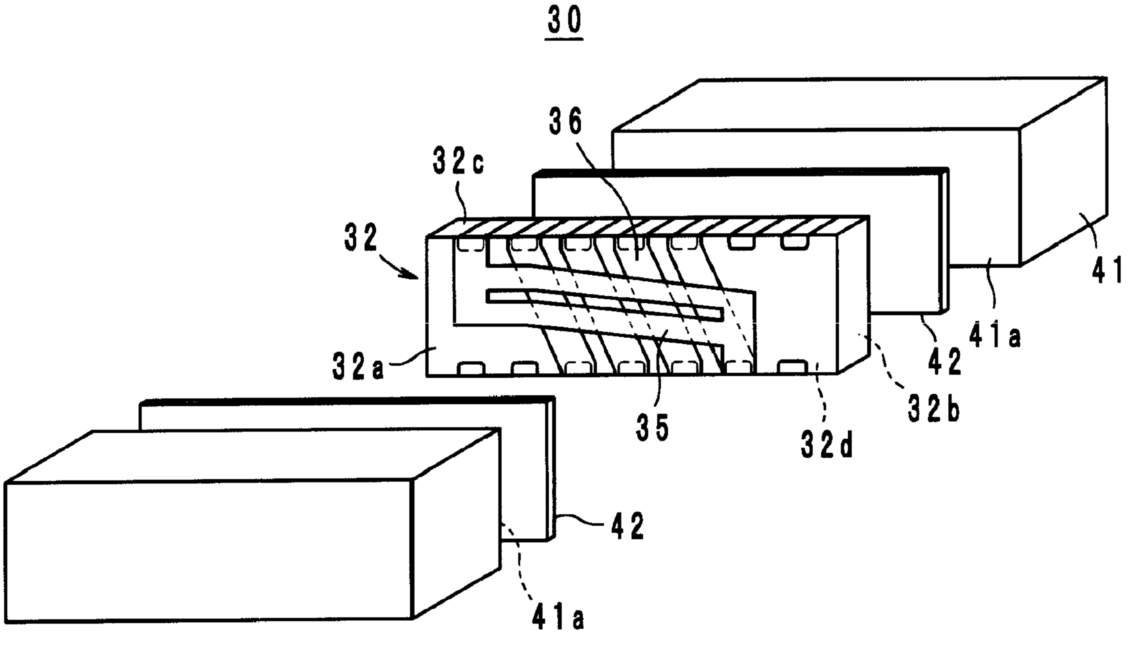
FIG. 4 is an exploded perspective view showing a ferrite magnet device.

The permanent magnets 41 are bonded to the principal surfaces 32*a* and 32*b* with, for example, an epoxy adhesive 42 therebetween so as to apply a direct current magnetic field to the ferrite body 32 in a direction substantially perpendicular to the principal surfaces 32*a* and 32*b* (refer to FIG. 4), so that the ferrite magnet device 30 is formed. A principal surface 41*a* of the permanent magnet 41 preferably has substantially the same dimensions as those of the principal surfaces 32*a* and 32*b* of the above-described ferrite body 32. The principal surfaces 32*a* and 41*a* are arranged opposite to each other and the principal surfaces 32*b* and 41*a* are arranged opposite each other.

The first center electrode 35 is made of a conductive film. That is, as shown in FIG. 2, the first center electrode 35 is arranged to rise from the lower right on the first principal surface 32*a* of the ferrite body 32, branch into two portions inclined toward the upper left direction at a relatively small angle relative to a long side, rise to the upper left, extend over to the second principal surface 32*b* through a relay electrode 35*a* on an upper surface 32*c*, and branch into two portions on the second principal surface 32*b* so as to be superimposed on the two portions on the first principal surface 32*a* when viewed in a see-through state, while one end thereof is connected to a connection electrode 35*b* disposed on a lower surface 32*d*. Furthermore, the other end of the first center electrode 35 is connected to a connection electrode 35*c* disposed on the lower surface 32*d*. In this manner, the first center electrode 35 is wound about 1 turn around the ferrite body 32. The first center electrode 35 and the second center electrode 36 described below intersect but are insulated from each other because an insulating film is disposed therebetween. The intersection angle of the center electrodes 35 and 36 is set as required, and the input impedance and the insertion loss are adjusted.

The second center electrode 36 is made of a conductive film. Regarding this second center electrode 36, the first half 36*a* of the first turn is arranged so as to be inclined from the lower right to the upper left on the first principal surface 32*a* at a relatively large angle relative to a long side while intersecting the first center electrode 35 and extends over to the second principal surface 32*b* through a relay electrode 36*b* on the upper surface 32*c*. The second half 36*c* of the first turn is arranged on the second principal surface 32*b* substantially vertically while intersecting the first center electrode 35. The lower end portion of the second half 36*c* of the first turn extends over to the first principal surface 32*a* through a relay electrode 36*d* on the lower surface 32*d*. The first half 36*e* of the second turn is arranged parallel or substantially parallel to the first half 36*a* of the first turn on the first principal surface 32*a* while intersecting the first center electrode 35 and goes over to the second principal surface 32*b* through a relay electrode 36*f* on the upper surface 32*c*. In a manner similar to that described above, the second half 36*g* of the second turn, a relay electrode 36*h*, the first half 36*i* of the third turn, a relay electrode 36*j*, the second half 36*k* of the third turn, a relay electrode 36*l*, the first half 36*m* of the fourth turn, a relay electrode 36*n*, and the second half 36*o* of the fourth turn are arranged on the surfaces of the ferrite body 32. Furthermore, the two end portions of the second center electrode 36 are connected to connection electrodes 35*c* and 36*p*, respectively, arranged on the lower surface 32*d* of the ferrite body 32. The connection electrode 35*c* is shared while defining connection electrodes of individual end portions of the first center electrode 35 and the second center electrode 36.

Figure 3:
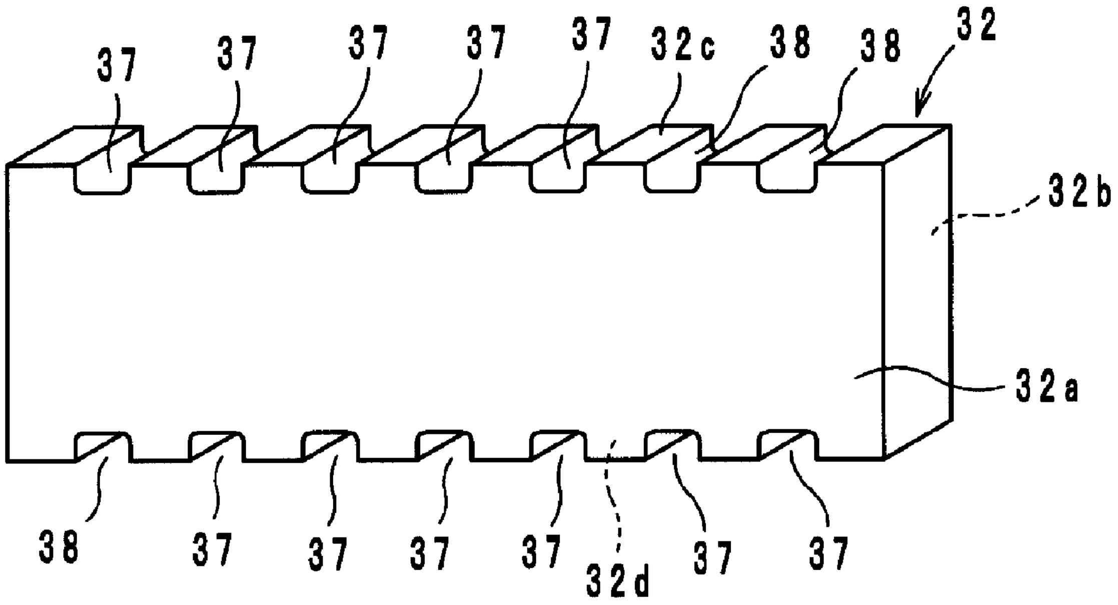
FIG. 3 is a perspective view showing an element assembly of the ferrite body.

The connection electrodes 35*b*, 35*c*, and 36*p* and the relay electrodes 35*a*, 36*b*, 36*d*, 36*f*, 36*h*, 36*j*, 36*l*, and 36*n* are formed by applying or filling an electrode conductor, e.g., silver, a silver alloy, copper, or a copper alloy, for example, into concave portions 37 (refer to FIG. 3) disposed in the upper and lower surfaces 32*c* and 32*d* of the ferrite body 32. Moreover, dummy concave portions 38 are also arranged parallel or substantially parallel to the various electrodes in the upper and lower surfaces 32*c* and 32*d*. In addition, dummy electrodes 39*a*, 39*b*, and 39*c* are provided. This type of electrode is formed by forming through holes in a mother ferrite substrate in advance, filling the through holes with the electrode conductor, and thereafter, performing cutting at locations suitable to divide the through holes. The various electrodes may preferably be formed as conductor films in the concave portions 37 and 38.

YIG ferrite or other suitable ferrite material is used for the ferrite body 32. The first and the second center electrodes 35 and 36 and various electrodes can preferably be formed as thick films or thin films of silver or a silver alloy, for example, by a method of printing, transfer, photolithography, or other suitable method. For the insulating film of the center electrodes 35 and 36, for example, a dielectric thick film of glass, alumina, or other suitable material or a resin film of polyimide or other suitable material may be used. These can also be formed by the method of printing, transfer, photolithography, or other suitable method, for example.

The ferrite body 32 can be integrally fired with the insulating film and various electrodes using a magnetic material. In this case, Pd, Ag, or Pd/Ag, for example, which endures high temperature firing, is preferably used for the various electrodes.

Usually, a strontium based, barium based, or lanthanum-cobalt based ferrite magnet, for example, is used for the permanent magnets 41. Preferably, a one-component thermosetting epoxy adhesive is used for the adhesive 42 for bonding the permanent magnets 41 and the ferrite body 32.

The substrate 20 is made of the same type of material as that for a common printed circuit board. The surface thereof is provided with the above-described ferrite magnet device 30, terminal electrodes 21*a*, 21*b*, 21*c*, and 22*a* to 22*j* arranged to mount chip type matching circuit devices C1, C2, CS1, CS2, and R, input and output electrodes, and a ground electrode (not shown in the drawing).

The above-described ferrite magnet device 30 is disposed on the substrate 20, and the electrodes 35*b*, 35*c*, and 36*p* on the lower surface 32*d* of the ferrite body 32 are reflow-soldered to the terminal electrodes 21*a*, 21*b*, and 21*c* on the substrate 20 so as to be integrated. In addition, the lower surface of the permanent magnet 41 is integrated on the substrate 20 with an adhesive. Moreover, the matching circuit devices C1, C2, CS1, CS2, and R are preferably reflow-soldered to the terminal electrodes 22*a* to 22*j* on the substrate 20.

Circuit Configuration

Figure 5:
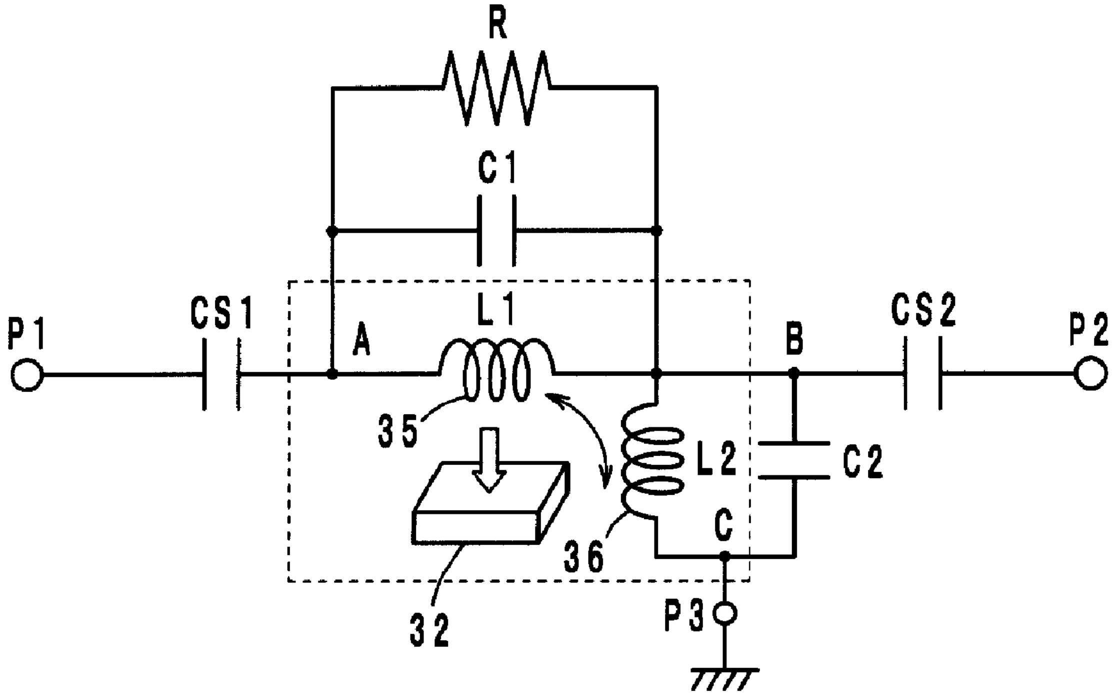
FIG. 5 is an equivalent circuit diagram showing an example of circuits of a two-port type isolator.

FIG. 5 is an equivalent circuit diagram showing an example of circuits of the isolator 1. An input port P1 is connected to the matching capacitor C1 and the terminating resistor R through the matching capacitor CS1, and the matching capacitor CS1 is connected to one end of the first center electrode 35. The other end of the first center electrode 35 and one end of the second center electrode 36 are connected to the terminating resistor R and the capacitors C1 and C2 and are connected to an output port P2 through the capacitor CS2. The other end of the second center electrode 36 and the capacitor C2 are connected to a ground port P3.

In the two-port type isolator 1 including the above-described equivalent circuit, one end of the first center electrode 35 is connected to the input port P1, the other end is connected to the output port P2, one end of the second center electrode 36 is connected to the output port P2, and the other end is connected to the ground port P3. Therefore, a two-port lumped-constant isolator having a relatively small insertion loss can be produced. Furthermore, during the operation, a relatively large high frequency current passes through the second center electrode 36 and almost no high frequency current passes through the first center electrode 35.

Moreover, in the ferrite magnet device 30, the ferrite body 32 and a pair of permanent magnets 41 are integrated with an adhesive 42 so as to be mechanically stable and, therefore, a rugged isolator which is not deformed or broken by vibrations and impacts is produced.

Production Process

Figure 6:
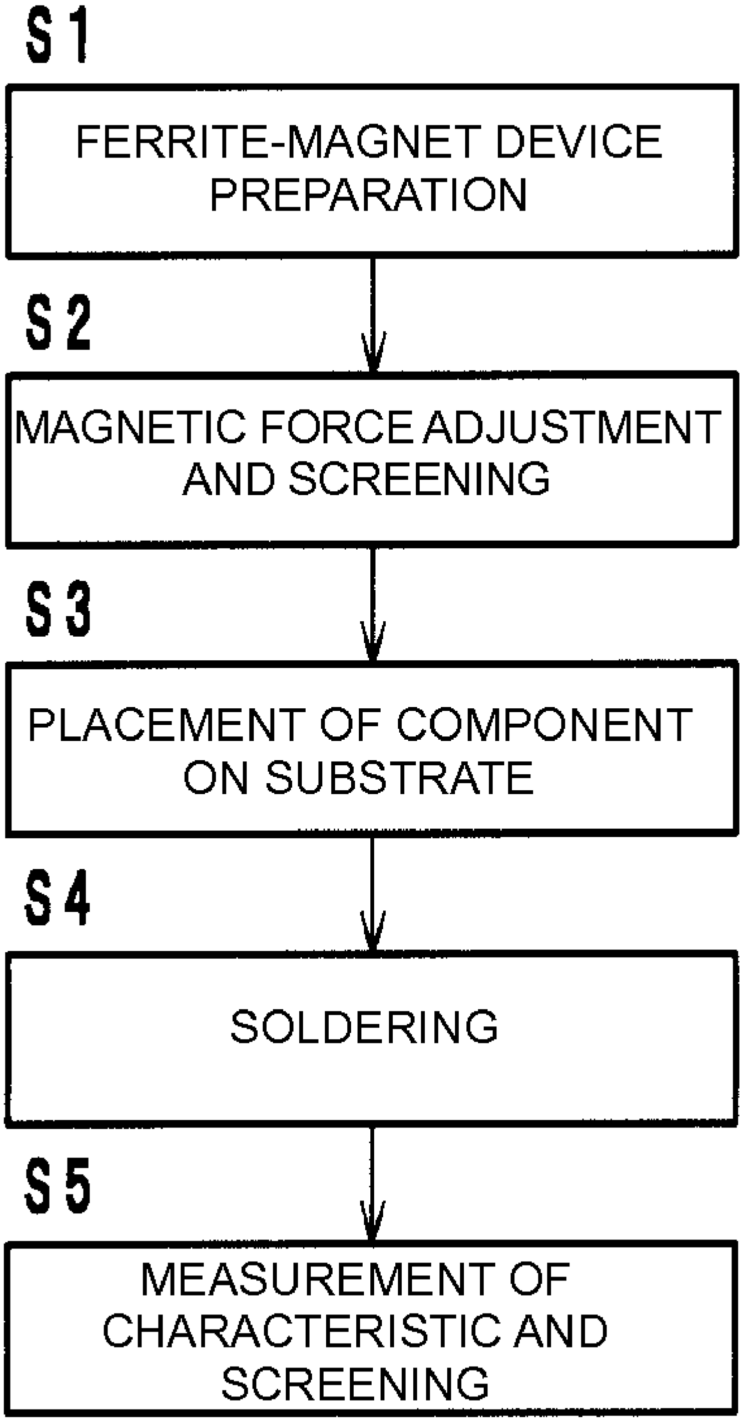
FIG. 6 is a flow chart diagram showing a production process.

The production process of the above-described isolator 1 will be described below with reference to FIG. 6. The ferrite magnet device 30 is prepared (Step S1), and regarding the prepared ferrite magnet device 30, magnetic force adjustment and screening of the permanent magnet 41 is conducted (Step S2). The magnetic force adjustment will be described below. Non-adjustable defective devices are excluded here.

A matching circuit device having a predetermined characteristic value is screened until this stage, and the above-described ferrite magnet device 30 and the matching circuit device are disposed on the substrate 20 (Step S3). Subsequently, soldering is conducted in a reflow furnace (Step S4). The characteristics of the resulting isolator 1 are measured and defective isolators are excluded (Step S5).

Magnetic Force Adjustment

Figure 7:
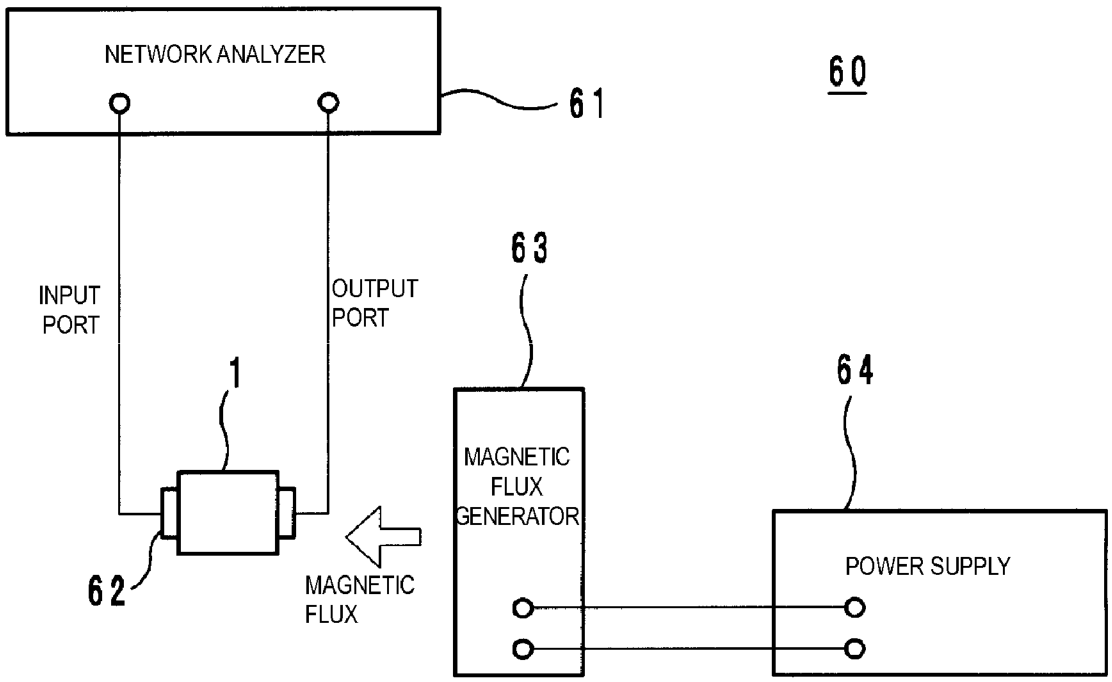
FIG. 7 is a schematic configuration diagram showing a magnetic force adjusting apparatus.

The magnetic force adjustment of the ferrite magnet device 30 is conducted using a magnetic force adjusting apparatus 60 shown in FIG. 7. The magnetic force adjusting apparatus 60 is provided with a measurement jig 62 connected to a network analyzer 61, a magnetic flux generator 63, and a power supply 64 thereof.

Figure 8:
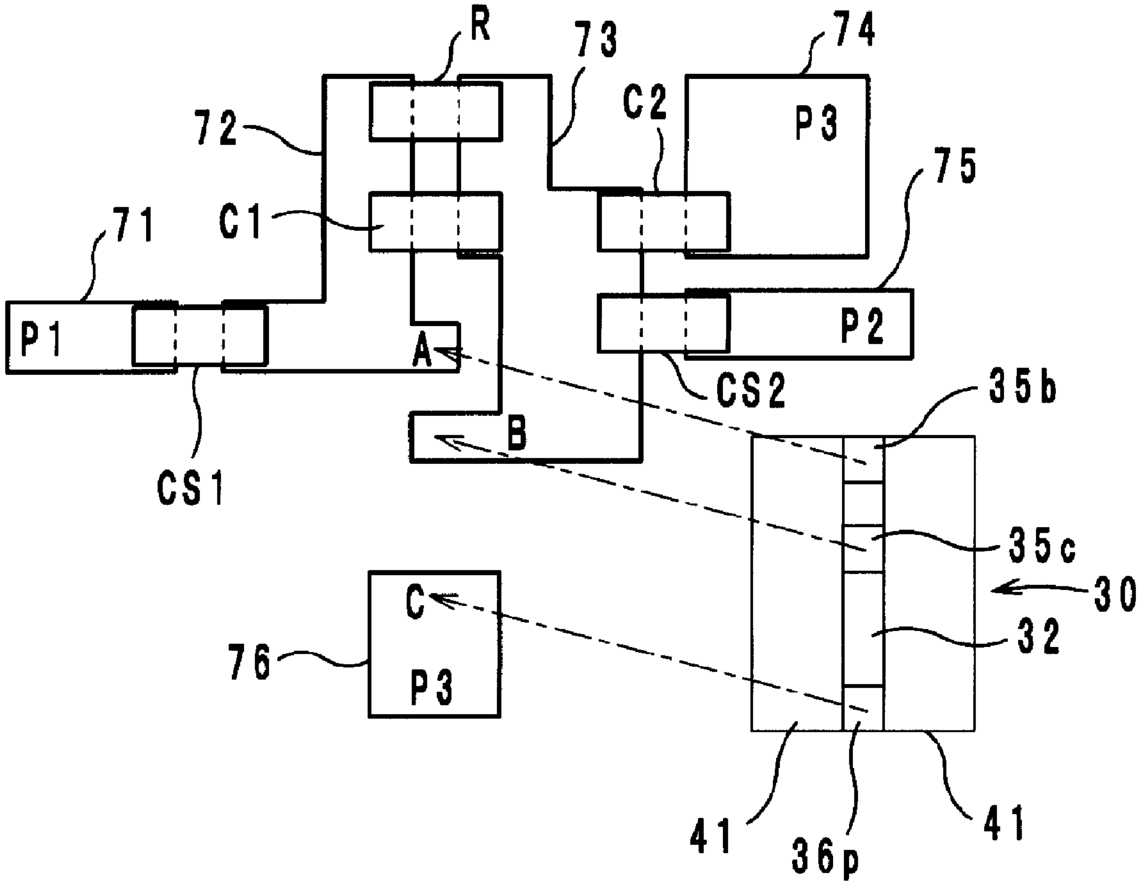
FIG. 8 is a plan view showing measurement electrodes disposed on a measurement jig.

The measurement jig 62 is provided with measurement electrodes 71, 72, 73, 74, 75, and 76 defining a pattern shown in FIG. 8. The matching capacitor CS1 is disposed between the measurement electrodes 71 and 72, the matching capacitor C1 and the terminating resistor R are disposed between the measurement electrodes 72 and 73, the matching capacitor C2 is dispose between the measurement electrodes 73 and 74, and the matching capacitor CS2 is disposed between the measurement electrodes 73 and 75. These matching circuit devices disposed in the measurement jig 62 are devices which are exclusive to the measurement and which are designed to have predetermined characteristic values.

The ferrite magnet device 30 is disposed on the pattern of the measurement jig 62 such that the electrode 35*b* which is one end of the first center electrode 35 is electrically connected to a portion A of the measurement electrode 72, the electrode 35*c* which is the other end of the first center electrode 35 and which is one end of the second center electrode 36 is electrically connected to a portion B of the measurement electrode 73, and the electrode 36*p* which is the other end of the second center electrode 36 is electrically connected to a portion C of the measurement electrode 76. The contact portions A, B, and C are also included in the equivalent circuit shown in FIG. 5. The circuit of the isolator 1 is preferably formed by disposing the ferrite magnet device 30 on the measurement jig 62. In this state, the characteristics are measured with the network analyzer 61, to which the input and output ports P1 and P2 are connected, the magnetic flux generator 63 is driven on the basis of the measurement values, a necessary magnetic flux is applied, and thereby, the magnetic force of the permanent magnet 41 is adjusted.

That is, the electrical characteristics (input output impedances) are adjusted while the ferrite magnet device 30 is set in the measurement jig 62. More specifically, the bias magnetic field (magnetic flux density) of the permanent magnet 41 is adjusted. The magnetic flux density of the permanent magnet 41 is adjusted by an electrical method in which a magnetic flux is applied to the permanent magnet 41 from the outside.

In a first method, a direct current magnetic field is generated by the magnetic flux generator 63 and is applied to the permanent magnet 41, the strength of the direct current magnetic field is increased as necessary and then is removed. At that time, the residual magnetic flux density of the permanent magnet 41 is increased to a required level. In a second method, a sufficiently high direct current magnetic field is generated by the magnetic flux generator 63, this direct current magnetic field is applied to the permanent magnet 41 and then is removed. The residual magnetic flux density of the permanent magnet 41 is thereby increased once to a value sufficiently higher than a required value (to the level of being substantially saturated). Thereafter, a direct current magnetic field in a reverse direction is generated by the magnetic flux generator 63 and is applied to the permanent magnet 41, so that the residual magnetic flux density of the permanent magnet 41 is reduced to the required value.

The ferrite magnet device 30 may be supplied to the user while the permanent magnets 41 are bonded to the principal surfaces 32*a* and 32*b* of the ferrite body 32 provided with the center electrodes 35 and 36, as described above. The user incorporates necessary matching circuits into the ferrite magnet device 30 so as to prepare a non-reciprocal circuit device. Alternatively, a module (composite electronic component 80, refer to FIG. 9) is prepared by combining the resulting non-reciprocal circuit device and a power amplifier. Alternatively, a module (composite electronic component 90, refer to FIG. 11) is prepared by combining two non-reciprocal circuit devices. Alternatively, a module (composite electronic component 95, refer to FIG. 12) is prepared by combining two pairs of a non-reciprocal circuit device and a power amplifier.

As described above, the magnetic force of the permanent magnet 41 is adjusted using the above-described measurement jig 62 and the magnetic force adjusting apparatus 60 while the permanent magnets 41 are fixed to the principal surfaces 32*a* and 32*b* of the ferrite body 32. Therefore, when the ferrite magnet device 30 is incorporated into various modules, the magnetic force of the permanent magnet 41, which is a prime factor causing variations in electrical characteristics, has already been adjusted, and non-adjustable ferrite magnet devices 30 have already been excluded. Consequently, wasting of mounting components, e.g., matching circuit devices and power amplifiers, to be incorporated into the module, can be prevented.

Furthermore, the measurement jig 62 provided with the measurement electrodes 71 to 76 having the electrical contact portions A, B, and C with respect to end portions of the center electrodes 35 and 36 and the predetermined matching circuit device is used. Therefore, the characteristics can be very simply measured. Moreover, the end electrodes 35*b*, 35*c*, and 36*p* of the center electrodes 35 and 36 are disposed on the surface 32*d* perpendicular or substantially perpendicular to the principal surfaces 32*a* and 32*b* of the ferrite body 32. Therefore, connection to the above-described measurement electrodes 71 to 76 can be very easily performed.

First Example of Composite Electronic Component

Figure 9:
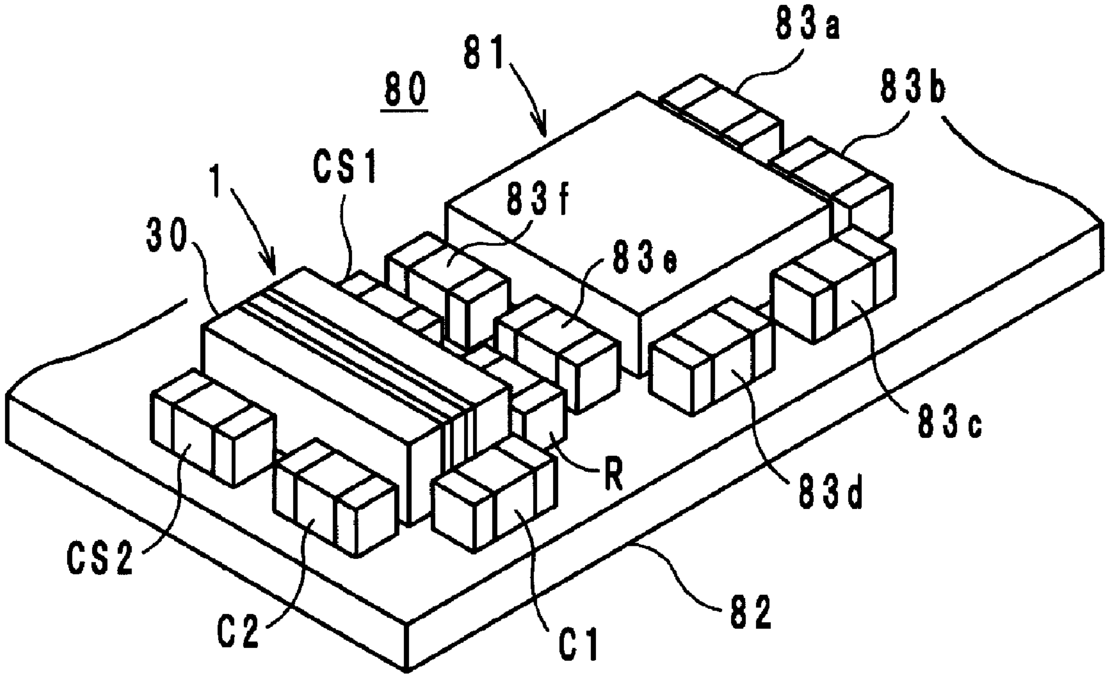
FIG. 9 is a perspective view showing a first example of a composite electronic component produced according to a preferred embodiment of the present invention.

FIG. 9 shows a first example of a composite electronic component according to a preferred embodiment of the present invention. This composite electronic component 80 is configured to function as a module by mounting the above-described isolator 1 and a power amplifier 81 on a printed circuit board 82. Necessary chip type circuit devices 83*a* to 83*f* are also mounted around the power amplifier 81. During the production process of the composite electronic component 80, the magnetic force of the permanent magnet 41 is adjusted using the above-described magnetic force adjusting apparatus 60 at the stage in which the ferrite magnet device 30 is prepared. This is also true for a second example and a third example, as described below.

Figure 10:
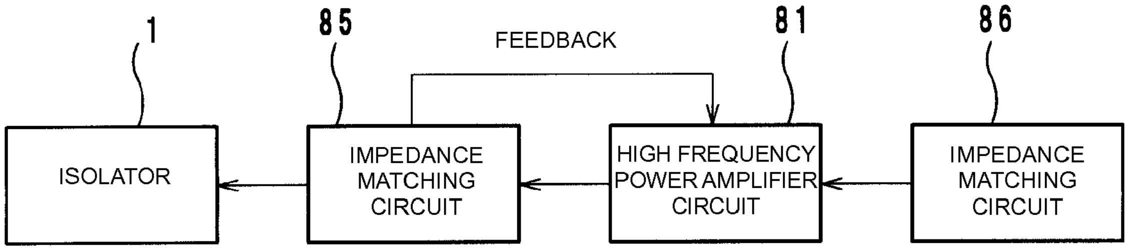
FIG. 10 is a block diagram showing a circuit configuration of the above-described first example.

FIG. 10 shows a circuit configuration of the composite electronic component 80. The output of an impedance matching circuit 86 is input into the high frequency power amplifier circuit 81, and the output thereof is input into the isolator 1 through an impedance matching circuit 85.

Second Example of Composite Electronic Component

Figure 11:
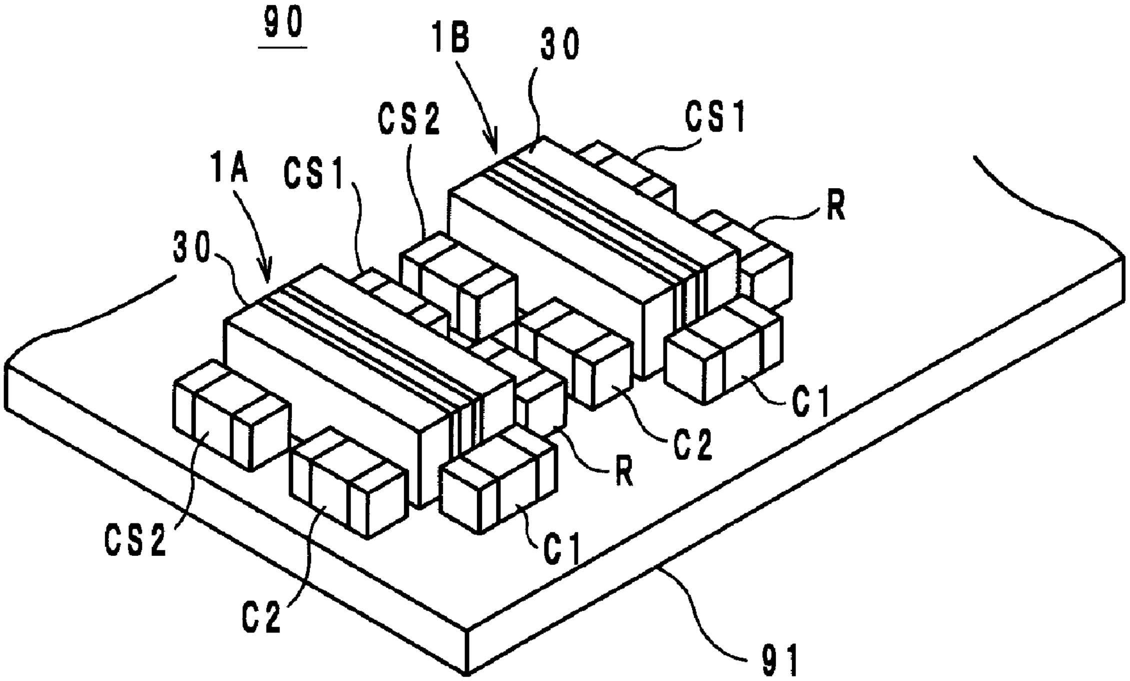
FIG. 11 is a perspective view showing a second example of a composite electronic component produced according to a preferred embodiment of the present invention.

FIG. 11 shows a second example of the composite electronic component according to a preferred embodiment of the present invention. This composite electronic component 90 is configured to function as a module by mounting isolators 1A and 1B on a printed circuit board 91. Isolators 1A and 1B have configurations similar to that of the above-described isolator 1. The isolator 1A is used in, for example, a band of about 800 MHz, and the isolator 1B is used in, for example, a band of about 2 GHz.

In general, an isolator used at about 800 MHz and an isolator used at about 2 GHz are different with respect to optimum operation magnetic fields and amounts of adjustment of magnetic force. If the isolators 1A and 1B having different operation bandwidths are mounted, it is difficult to adjust the magnetic forces of the isolators 1A and 1B individually at the stage of an assembled composite electronic component. On the other hand, in the present example, the magnetic forces are individually adjusted while the ferrite magnet device 30 is prepared. Therefore, the adjustment is easily performed, and, in addition, optimum characteristics can be obtained. Such an advantage is also achieved in a third example described below.

Third Example of Composite Electronic Component

Figure 12:
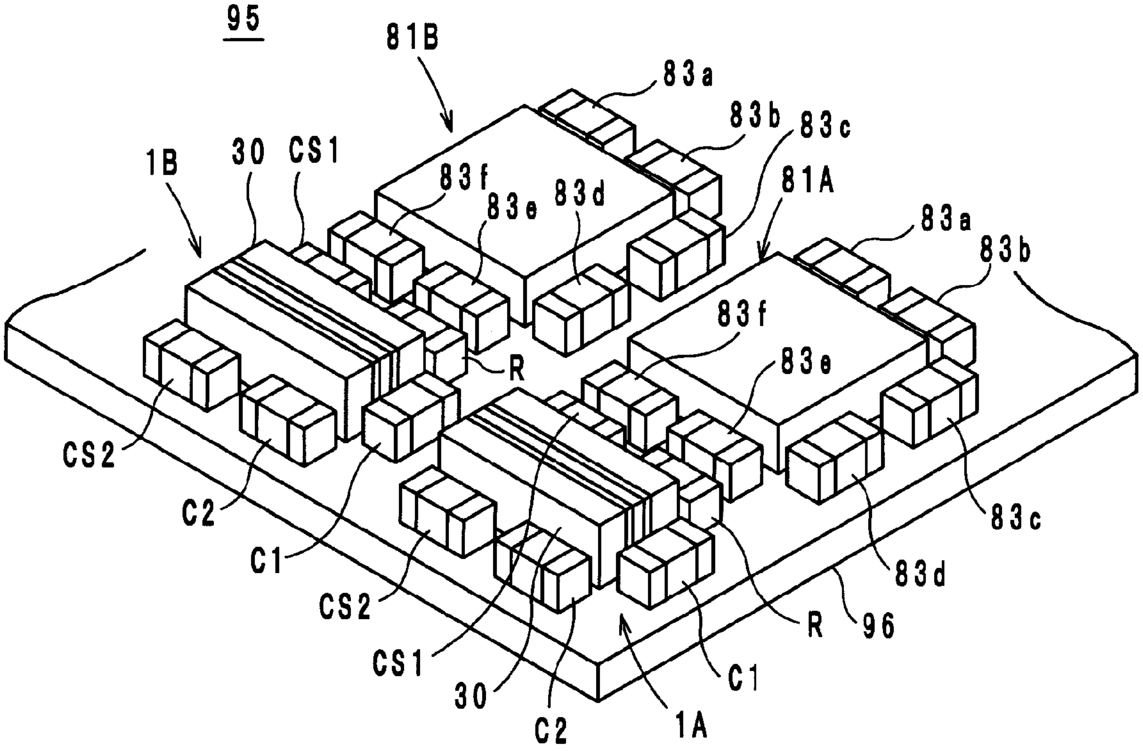
FIG. 12 is a perspective view showing a third example of a composite electronic component produced according to a preferred embodiment of the present invention.

FIG. 12 shows the third example of the composite electronic component according to a preferred embodiment of the present invention. This composite electronic component 95 is configured to function as a module by mounting a pair of the isolator 1A and a power amplifier 81A and a pair of the isolator 1B and a power amplifier 81B on a printed circuit board 96 individually.

The method for manufacturing a ferrite magnet device, the method for manufacturing a non-reciprocal circuit device, and the method for manufacturing a composite electronic component according to preferred embodiments of the present invention are not limited to the above-described examples and can be modified variously within the scope of the invention.

In particular, the matching circuit may have any suitable configuration, and at least one matching circuit device may be incorporated in a substrate. In the ferrite magnet device, the ferrite body and the permanent magnet may be integrally provided, or the permanent magnet may be fixed to a principal surface of the ferrite body. Furthermore, a planar yoke may be disposed on an upper surface of the ferrite magnet device.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a ferrite magnet device comprising the steps of:

providing a ferrite magnet device including a ferrite body and a plurality of center electrodes arranged so as to intersect and be electrically insulated from each other and a permanent magnet arranged to apply a direct current magnetic field to the ferrite body; and simultaneously measuring frequency-characteristics of the permanent magnet and adjusting a magnetic force of the permanent magnet using a measurement jig while the permanent magnet is fixed to a principal surface of the ferrite body.

2. The method according to claim 1, wherein the measurement jig is provided with electrical contact portions corresponding to end portions of the center electrodes and a predetermined matching circuit device is provided.

3. The method according to claim 1, wherein the permanent magnet is fixed to a principal surface of the ferrite body.

4. The method according to claim 1, wherein the permanent magnet is bonded to the principal surface of the ferrite body.

5. The method according to claim 1, wherein end electrodes of the center electrodes are disposed on a surface perpendicular or substantially perpendicular to the principal surface of the ferrite body.

6. A method for manufacturing a non-reciprocal circuit device comprising the steps of:

providing a non-reciprocal circuit device including a ferrite magnet device having a ferrite body and a plurality of center electrodes arranged so as to intersect and be electrically insulated from each other and a permanent magnet arranged to apply a direct current magnetic field to the ferrite body;

simultaneously measuring frequency-characteristics of the permanent magnet and adjusting a magnetic force of the permanent magnet using a measurement jig while the permanent magnet is fixed to a principal surface of the ferrite body; and assembling the ferrite magnet device and other devices after the adjustment.

7. The method according to claim 6, wherein the measurement jig is provided with electrical contact portions corresponding to end portions of the center electrodes and a predetermined matching circuit device is provided.

8. The method according to claim 6, wherein end electrodes of the center electrodes are arranged on a surface perpendicular or substantially perpendicular to the principal surface of the ferrite body.

9. A method for manufacturing a composite electronic component comprising the steps of:

providing a composite electronic component including a ferrite magnet device having a ferrite body and a plurality of center electrodes arranged so as to intersect and be electrically insulated from each other and a permanent magnet for applying a direct current magnetic field to the ferrite body;

simultaneously measuring frequency-characteristics of the permanent magnet and adjusting a magnetic force of the permanent magnet using a measurement jig while the permanent magnet is fixed to a principal surface of the ferrite body; and assembling the ferrite magnet device and other devices after the adjustment.

10. The method according to claim 9, wherein the measurement jig is provided with electrical contact portions corresponding to end portions of the center electrodes and a predetermined matching circuit device is provided.

11. The method according to claim 9, wherein end electrodes of the center electrodes are arranged on a surface perpendicular or substantially perpendicular to the principal surface of the ferrite body.

* * * * *